(12) United States Patent
Riedl (10) Patent No.: US 9,628,037 B2
(45) Date of Patent: *Apr. 18, 2017

(54) METHODS AND SYSTEMS FOR DETERMINING AUDIO LOUDNESS LEVELS IN PROGRAMMING

(71) Applicant: Time Warner Cable Enterprises LLC, New York, NY (US)

(72) Inventor: Steven E. Riedl, Superior, CO (US)

(73) Assignee: TIME WARNER CABLE ENTERPRISES LLC, New York, NY (US)

(*) Notice: Subject to any disclaimer, the term of this patent is extended or adjusted under 35 U.S.C. 154(b) by 785 days.

This patent is subject to a terminal disclaimer.

(21) Appl. No.: 13/765,552

(22) Filed: Feb. 12, 2013

(65) Prior Publication Data

US 2013/0156229 A1  Jun. 20, 2013

Related U.S. Application Data

(63) Continuation of application No. 12/131,649, filed on Jun. 2, 2008, now Pat. No. 8,379,880, which is a continuation of application No. 10/647,628, filed on Aug. 25, 2003, now Pat. No. 7,398,207.

(51) Int. Cl.
| | |
|---|---|
| H03G 3/00 | (2006.01) |
| H03G 3/20 | (2006.01) |
| H03G 7/00 | (2006.01) |
| H03G 9/00 | (2006.01) |
| H04N 21/233 | (2011.01) |

(52) U.S. Cl.
CPC ............ *H03G 3/20* (2013.01); *H03G 3/001* (2013.01); *H03G 7/007* (2013.01); *H03G 9/005* (2013.01); *H04N 21/2335* (2013.01)

(58) Field of Classification Search
CPC .......... H03G 7/00; H03G 7/001; H03G 7/007; H03G 3/20; H03G 9/005
USPC ..................... 381/104–109, 22–23
See application file for complete search history.

(56) References Cited

U.S. PATENT DOCUMENTS

| | | | |
|---|---|---|---|
| 3,836,717 | A | 9/1974 | Gagnon |
| 4,956,865 | A | 9/1990 | Lennig |
| 5,581,621 | A | 12/1996 | Koyama |
| 5,631,714 | A | 5/1997 | Saadoun |
| 5,983,176 | A | 11/1999 | Hoffert |
| 6,029,129 | A | 2/2000 | Kliger |
| 6,249,760 | B1 | 6/2001 | Bossemeyer |

(Continued)

OTHER PUBLICATIONS

"NCTA Engineering Committee Recommended Procedure, QSS-Analog.1," Apr. 2003, Dolby Laboratories, Inc, pp. 1-7.

(Continued)

*Primary Examiner* — Disler Paul
(74) *Attorney, Agent, or Firm* — Otterstedt, Ellenbogen & Kammer, LLP (57) ABSTRACT

A program asset is retrieved. The program asset has audio encoded at a first loudness setting and includes metadata specifying the first loudness setting. Dialog of the audio is identified. The loudness of the dialog is determined. The determined loudness is compared to the first loudness setting. The program asset is re-recorded at a second loudness setting corresponding to the determined loudness, if the first loudness setting and the determined loudness are different by more than a predetermined amount.

32 Claims, 7 Drawing Sheets

(56) References Cited

U.S. PATENT DOCUMENTS

| | | | |
|---|---|---|---|
| 6,356,871 B1 | 3/2002 | Hemkumar | |
| 6,366,888 B1 | 4/2002 | Kroon | |
| 6,442,278 B1* | 8/2002 | Vaudrey | H04R 3/005 381/104 |
| 6,651,040 B1 | 11/2003 | Bakis | |
| 6,985,594 B1* | 1/2006 | Vaudrey | H04R 3/005 381/104 |
| 7,050,966 B2 | 5/2006 | Schneider | |
| 7,113,522 B2 | 9/2006 | El-Maleh | |
| 7,190,292 B2 | 3/2007 | Bizjak | |
| 7,398,207 B2 | 7/2008 | Riedl | |
| 7,415,120 B1* | 8/2008 | Vaudrey et al. | 381/109 |
| 7,454,331 B2* | 11/2008 | Vinton et al. | 704/225 |
| 8,379,880 B2 | 2/2013 | Riedl | |
| 2003/0035549 A1 | 2/2003 | Bizjak | |
| 2003/0144838 A1 | 7/2003 | Allegro | |
| 2003/0182105 A1 | 9/2003 | Sall | |
| 2004/0044525 A1 | 3/2004 | Vinton | |
| 2004/0143434 A1 | 7/2004 | Divakaran | |
| 2004/0175008 A1 | 9/2004 | Roeck | |

OTHER PUBLICATIONS

"DTV Audio: Understanding Dialnorm," www.wtvcookbook.org/audio/dialnorm.html, Mar. 27, 2003, Local Enhancement Collaborative & CPB, pp. 1-3.

"NCTA Quality Sound Subcommittee-Audio Summit Meeting," Jan. 17, 2003, pp. 1-2.

"Preliminary Specifications; LM100 Broadcast Loudness Meter," www.dolby.com/products/ LM 100/LM 1 OOspecs.html, 2003, Dolby Laboratories, Inc., pp. 1-3.

"LM100 Broadcast Loudness Meter," 2003, Dolby Laboratories, Inc., San Francisco, CA, pp. 1-2.

Jeffrey C.Riedmiller, "Guidelines for the Analysis and Measurement of Speech Levels for Broadcast, Satellite, and Cable Relevision". Dolby Laboratories, Inc. Updatedories, Inc. Undated: at least as early as Apr. 18, 2005, pp. 1-5.

Tim Carroll, "DTV and the Annoyingly Loud Commercial Problem'," www.tvtechnology.com/features/audio_notes/f-TC-dtv.shtml, Sep. 18, 2002, TVTechnology.com, pp. 1-3.

Tim Carroll, "Audio Metadata: You Can Get There From Here," www.tvtechnology.com/features/audio_notes/f-TC-metadata-08.21.02.shtml, Aug. 21, 2002, TVTechnology.com, pp. 1-4.

Tim Carroll, "A Closer Look at Audio Metadata," www.tvtechnology.com/features/audio_notes/f-tc-metadata.shtml, Jul. 24, 2002, TVTechnology.com, pp. 1-5.

Tim Carroll, "Exploring the AC-3 Audio Standard for ATSC," www.tvtechnology.com/features/audio_notes/f-TC-AC3-06.26.02.shtml, Jun. 26, 2002, TVTechnology.com, pp. 1-4.

"LM100 Broadcast Loudness Meter," www.dolby.com/products/LM100/index.html, 2002, Dolby Laboratories, Inc., pp. 1-2.

Tomlinson Holman, "Level: The Hottest Topic in Audio," www.digitaltelivision.com/2001/expert/th02.shtml, Jun. 9, 2001, United Entertainment Media. and United Business Media, pp. 1-4.

"Digital Audio Compression Standard (AC-3)," Dec. 20, 1995, Advanced Television Systems Committee, pages cover, i-viii, 1-130.

Craig C. Todd, Grant a Davidson, Mark F. Davis, Louis D. Fielder, Briand. Link, Steve-Vernon, "AC-3: Flexible Perceptual Coding for Audio Transmission and Storage," www.dolby.com/tech/ac3flex.html, Mar. 1, 1994, Audio Engineering Society, Inc., pp. 1-14.

Untitled Document relating to audio requirements for Open Cable™ Host Device Core Functional Requirements. Undated: at least as early as Apr. 18, 2005, pp. 1-4.

\* cited by examiner

METHODS AND SYSTEMS FOR DETERMINING AUDIO LOUDNESS LEVELS IN PROGRAMMING

CROSS-REFERENCE TO RELATED APPLICATIONS

This application is a continuation, under 37 CFR 1.53(b), of co-assigned U.S. patent application Ser. No. 12/131,649 of inventor Steven E. Riedl, which will issue on Feb. 19, 2013 as U.S. Pat. No. 8,379,880, which application is in turn a continuation, under 37 CFR 1.53(b), of co-assigned U.S. patent application Ser. No. 10/647,628 of inventor Steven E. Riedl, now U.S. Pat. No. 7,398,207. Said application Ser. No. 12/131,649 was filed on Jun. 2, 2008, and entitled "Methods and Systems for Determining Audio Loudness Levels in Programming," and said application Ser. No. 10/647,628 was filed on Aug. 25, 2003, and entitled "Methods and Systems for Determining Audio Loudness Levels in Programming." The complete disclosures of the aforesaid application Ser. Nos. 10/647,628 and 12/131,649 are expressly incorporated herein by reference in their entireties for all purposes.

FIELD OF THE INVENTION

The invention relates to communications methods, systems and more particularly, to processing audio in communications methods and systems.

BACKGROUND OF THE INVENTION

Personal video recorders (PVRs), also known as digital video recorders (DVRs), such as TiVO and ReplayTV devices, are popular nowadays for their enhanced capacities in recording television programming. They may offer such functions as "one-touch programming" for automatically recording every episode of a show for an entire season, "commercial advance" for automatically skipping through commercials while watching a recorded broadcast, an "on-screen guide" for looking up recorded programs to view, etc. The PVRs may also suggest programs for recording based on a user's viewing habit. These devices also enable the "pausing", "rewinding" and "fast-forwarding" of a live television ("TV") broadcast while it is being recorded. However, PVRs typically use electronic program guides (EPGs) to facilitate the selection of programming content for recording. In instances where the actual broadcast start or end time of a program is different than the EPG start or end time, programming content is often recorded that the user did not want, or all of the programming content that the user intended to record is not actually recorded. The program guide data stream is typically provided by a third party that aggregates program scheduling information from a plurality of sources of programming.

The actual start and end times for a given broadcast program may be different than the EPG start and end times for various reasons. For example, overtime in a sports event may cause the event to go beyond the scheduled end time. Presidential news conferences, special news bulletins and awards ceremonies often have indeterminate endings, as well. Technical difficulties causing the content provider to broadcast a program at a time other than that which is scheduled may also cause a variance in the start and/or end time of a program. In addition, when the time of one program provided on a specific channel is off schedule, subsequent programs provided by the channel may also be unexpectedly affected, interfering with the ability to record the subsequent program. To avoid offsetting the start and end times of subsequent programs, scheduled programming content may be manipulated (for example, a certain program or commercial segment may be skipped and therefore not broadcast), which may prevent programming of the skipped program. This makes recording programs for later viewing difficult.

Video on demand ("VOD"), movie on demand ("MOD") and network PVR services, which may be subscription services, address at least some of these disadvantages by storing broadcasted programs for later retrieval by customers. Movies and TV programs (referred to collectively as "programs") may be acquired and stored in real time, from multiple origination points. Typically, entire program streams for each broadcast channel are stored each day. When a customer requests a particular program that has already been broadcast and stored, the system may fetch the content of the requested program from storage in a network based on the program channel and time in an EPG, and transmit the program to the customer. An example of a network PVR system is described in copending, commonly assigned application Ser. No. 10/263,015, filed on Oct. 2, 2002.

With the advent of digital communications technology, many TV broadcast streams are transmitted in digital formats. For example, Digital Satellite System (DSS), Digital Broadcast Services (DBS), and Advanced Television Standards Committee (ATSC) broadcast streams are digitally formatted pursuant to the well known Moving Pictures Experts Group 2 (MPEG-2) standard. The MPEG-2 standard specifies, among others, the methodologies for video and audio data compressions which allow multiple programs, with different video and audio feeds, multiplexed in a transport stream traversing a single broadcast channel. Newer systems typically use the Dolby Digital AC-3 standard to encode the audio part of the transport stream, instead of MPEG-2. The Dolby Digital AC-3 standard was developed by Dolby Digital Laboratories, Inc., San Francisco, Calif. ("Dolby"). A digital TV receiver may be used to decode the encoded transport stream and extract the desired program therefrom. The prior art PVRs take advantage of compression of video and audio data to maximize the use of their limited storage capacity, while decreasing costs.

In accordance with the MPEG-2 standard, video data is compressed based on a sequence of groups of pictures ("GOPs"), in which each GOP typically begins with an intra-coded picture frame (also known as an "I-frame"), which is obtained by spatially compressing a complete picture using discrete cosine transform (DCT). As a result, if an error or a channel switch occurs, it is possible to resume correct decoding at the next I-frame.

The GOP may represent up to 15 additional frames by providing a much smaller block of digital data that indicates how small portions of the I-frame, referred to as macroblocks, move over time. Thus, MPEG-2 achieves its compression by assuming that only small portions of an image change over time, making the representation of these additional frames extremely compact. Although GOPs have no relationship between themselves, the frames within a GOP have a specific relationship which builds off the initial I-frame.

The compressed video and audio data are carried by respective continuous elementary streams. The video and audio streams are multiplexed. Each stream is broken into packets, resulting in packetized elementary streams (PESs). These packets are identified by headers that contain time stamps for synchronization, and are used to form MPEG-2 transport streams. For digital broadcasting, multiple programs and their associated PESs are multiplexed into a single transport stream. A transport stream has PES packets further subdivided into short fixed-size data packets, in which multiple programs encoded with different clocks can be carried. A transport stream not only comprises a multiplex of audio and video PESs, but also other data such as MPEG-2 program specific information ("PSI") describing the transport stream. The MPEG-2 PSI includes a program associated table ("PAT") that lists every program in the transport stream. Each entry in the PAT points to a program map table (PMT) that lists the elementary streams making up each program. Some programs are open, but some programs may be subject to conditional access (encryption) and this information is also carried in the MPEG-2 PSI.

The aforementioned fixed-size data packets in a transport stream each carry a packet identifier ("PID") code. Packets in the same elementary streams all have the same PID, so that a decoder can select the elementary stream(s) it needs and reject the remainder. Packet-continuity counts are implemented to ensure that every packet that is needed to decode a stream is received.

The Dolby Digital AC-3 format, mentioned above, is described in the Digital Audio Compression Standard (AC-3), issued by the United States Advanced Television Systems Committee ("ATSC") (Dec. 20, 1995), for example, which is incorporated by reference, herein. The AC-3 digital compression algorithm encodes pulse code modulation ("PCM") samples of 1 to 5.1 channels of source audio into a serial bit stream at data rates from 32 kbps to 640 kbps. (The 0.1 channel refers to a fractional bandwidth channel for conveying only low frequency (subwoofer sounds)). An AC-3 encoder at a source of programming produces an encoded bit stream, which is decoded by an AC-3 decoder at a receiver. The receiver may be at a distributor of programming, such as a cable system, or at a set-top box at the consumer's location, for example. The encoded bit stream is a serial stream comprising a sequence of synchronization frames. Each frame contains 6 coded audio blocks, each representing 256 new audio samples. A synchronization frame header is provided containing information required to synchronize and decode the signal stream. A bit stream header follows the synchronization stream header, describing the coded audio service. An auxiliary data field may be provided after the audio blocks. An error check field may be provided, as well. The AC-3 encoded audio stream is typically multiplexed with the MPEG-2 program stream.

Program audio is provided to a distributor, such as a cable system, by a source with a set level of loudness. The audio is typically broadcast by the distributor at the set loudness. Viewers adjust the loudness level to meet their own subjective, desired level by adjusting the volume control on their TV. Viewers typically watch programming provided by different sources and there is no currently accepted standard for setting loudness of audio provided with programs. Each source typically sets a loudness level in accordance with their own practices. For example, a cable system broadcasts a program comprising content by one source and advertising provided by one or more other sources. As viewers change channels, they may also view programs from different sources. In VOD, MOD and network PVR systems, programs viewed on the same channel may also have been provided to the systems by different sources. Ideally, once a viewer sets the volume control of their TV to a desired volume, it would not be necessary to adjust the volume control. Often, however, there are sudden loudness changes as a program transitions to and from advertising with different loudness settings or from one program to another program with a different loudness setting, requiring the viewer to adjust the volume. This can be annoying.

Loudness is a subjective perception, making it difficult to measure and quantify. The most commonly used devices to measure loudness are Voltage Unit ("VU") meters and Peak Program Meters ("PPM"), which measure voltages of audio signals. These devices do not take into consideration the sensitivities and hearing patterns of the human ear, however, and listeners may still complain about loudness of audio at apparently acceptable voltages.

In an attempt to quantify loudness as it is perceived by a listener, CBS Laboratories developed a loudness meter in the 1960's that divided audio signals into seven (7) bands, weighted the gain of each band to match the equal loudness curve of the human ear, averaged each band with a given time constant, summed the averages, and averaged the total again with a time constant about 13 times longer than the first time constant. A few broadcast audio processor manufacturers currently use an algorithm based on the CBS Loudness Meter to detect audio that could sound too loud to a listener. Gain reduction is applied to reduce the loudness. (Audio Notes: Tim Carroll, Exploring the AC-3 Audio Standard for ATSC (retrieved from TV Technology dot com, www dot tvtechnology dot com, Jun. 26, 2002)).

Equivalent Loudness ("Leq (A)") has also been used to quantify and control the loudness of normal spoken dialog. Leq (A) is the level of constant sound in decibels, which, in a given time period, has the same energy as a time-varying sound. The measurement is A network-weighted, which relates to the sensitivity of the human ear at low levels.

In analog programs, audio levels have been set with respect to reference levels dependent on the content of the program. Automatic gain control ("AGC") and level matching algorithms have been implemented in hardware to adjust audio levels of analog signals as necessary. AGC cannot be used with compressed digital signals, and does not take dialog levels into account.

In the Dolby AC-3 standard, a Dialog Level (dialog normalization or "DIALNORM") parameter is used to provide an optimum base or reference level of loudness upon which a viewer may adjust the loudness of the broadcast program with the volume control of their TV. DIALNORM is an indication of the subjective loudness of normal spoken dialog as compared to a maximum loudness (100% digital, full scale). It represents the normalized average loudness of the dialog in the program, as measured by Leq (A). DIALNORM may range from −31 decibels ("dBs") to 0 dBs which is 100% digital. The DIALNORM value may be stored in the synchronization frame of the encoded audio stream, for example. The DIALNORM value is used by the system volume control, in conjunction with the volume set by the viewer, to establish a desired loudness (sound pressure level) of the program.

For example, the loudness of a program with a-DIALNORM of −27 dBs and a TV volume control setting of 2, for example, will sound the same to the viewer as a program, advertising or chapter with a DIALNORM of −31 dBs and a TV volume control setting of 2, even though the respective DIALNORMS are different, as long as the DIALNORM for each respective program is properly set. The user will not have to change the volume control as the programming changes from program to program or program to advertising. If programs on different channels are broadcast/transmitted at the proper DIALNORM, the volume setting would not need to be changed when the channels are changed, either.

An LM100 Level Meter, available from Dolby, may be used by sources of programming to determine the proper DIALNORM. As currently understood, the audio from a program is provided to the LM100, which is said to analyze only the dialog portion of the audio to measure program loudness based on Leq (A). The audio provided to the LM100 is not compressed. The DIALNORM value of the audio is displayed. While available, it is believed that the LM100 level meter is not being used by sources of programming to set the loudness of programs they provide. Since there is currently no industry standard for dealing with loudness, sources of programming are free to set DIALNORM in their own way. DIALNORM is often not set or is set to a default value of −27 dBs in the Dolby Encoder, which might not be the optimum DIALNORM for a particular program. −31 dBs is often used, which is very low. Different encoders also have different settings. Because the DIALNORMs are not properly set, as channels are changed and as a program shifts to an advertising, the volume may be too loud or too soft and require adjustment by the viewer.

As mentioned above, distributors typically do not adjust the loudness of audio received from sources of programming. For example, cable systems may only manually adjust the loudness level set by an encoder, daily or weekly, if at all. This is not sufficient to provide consistent loudness between a program and the advertising included in the program, which may be provided by a different source. Audio levels have not been adjusted on a per program basis. One reason for this may be that cable systems typically broadcast programming upon receipt from a source, in real time. Audio adjustments must therefore be made in real time, as well. An LM100 could not, therefore, be used to efficiently and automatically adjust known, commercially available encoders.

Mismatched dynamic ranges can also cause loudness problems. Programs with large variation between the softest and loudest sounds (large dynamic range) are difficult to match to programs that have smaller dynamic ranges. Commercials typically have little dynamic range, to keep the dialog clear.

Dolby provides a Digital Dynamic Range Control ("DRC") system in encoders to calculate DRC metadata based on a pre-selected DRC Profile. Profiles are provided for different types of programs. Profiles include Film Light, Film Standard, Film Heavy, Music Light, Music Standard, Speech and None. The station or content producer selects the appropriate profile. The system provides the metadata along with the audio signal in the synchronization frame, for example. The Dolby Digital Decoder can use the metadata to adjust the dynamic range of the audio signal based on the profile.

Incorrect setting of the DRC can cause large loudness variations that can interfere with a viewer's listening experience. The DRC can be reduced or disabled by listeners.

SUMMARY OF THE INVENTION

In accordance with an embodiment of the invention, a method of correcting an audio level of a stored program asset is disclosed comprising retrieving a stored program asset having audio encoded at a first loudness setting. The method further comprises identifying dialog of the asset, determining a loudness of the dialog and comparing the determined loudness to the first loudness setting. The method further comprises re-encoding the asset at a second loudness setting corresponding to the determined loudness, if the first loudness setting and the second loudness are different by more than a predetermined amount. The determined loudness is preferably normalized. The loudness setting and normalized determined loudness may each be DIALNORM, for example. The asset may then be stored with the re-encoded loudness setting.

The dialog may be identified by dividing the audio into time intervals, determining a loudness of each interval and identifying intervals with intermediate loudnesses. Intervals with intermediate loudnesses, which is considered to be dialog, may be identified by creating a histogram of the loudnesses of the intervals. The loudness of each interval may be based on psycho-acoustic criteria, such as Leq (A), for example. A loudness of all of the intervals having intermediate loudnesses may be determined by computing a function of the loudnesses of each of the intervals having intermediate loudnesses. The function may be an average, a mean or a median of the loudnesses of the intervals having intermediate loudness. The DIALNORM of the intervals having intermediate loudnesses may be determined, for example.

Dialog may also be identified by filtering the audio. For example, the audio can be filtered to remove audio outside of a range of from about 100 Hertz to about 1,000 Hertz.

The method may further comprise correcting compression of the audio of the program.

Prior to identifying the dialog, the method may also comprise demultiplexing the audio from the program, decompressing the audio, converting the audio to a pulse coded modulation format, performing automatic gain control on the audio, and/or filtering the audio. In accordance with another embodiment of the invention, a method of correcting an audio level of a stored program asset is disclosed comprising retrieving a stored program asset having audio encoded at a loudness setting and demultiplexing the audio from the retrieved asset. The method further comprises decompressing the audio, identifying dialog of the audio and determining DIALNORM of the dialog. The method further comprises comparing the DIALNORM to the encoded loudness setting and re-encoding the asset at the DIALNORM if the encoded loudness and the DIALNORM are different by more than a predetermined amount. The asset is stored with the re-encoded DIALNORM. The compression of the audio may be corrected, as well.

In accordance with another embodiment of the invention, a method of processing an audio level of a stored program asset is disclosed comprising retrieving a stored program asset having audio encoded at a loudness setting, identifying dialog of the asset, determining a loudness of the dialog and comparing the determined loudness to the loudness setting.

In accordance with another embodiment of the invention, a system for correcting an audio level of a stored program asset is disclosed comprising means for retrieving a stored program asset having audio encoded at a first loudness setting. Means for identifying dialog of the asset, means for determining a loudness of the dialog and means for re-encoding the asset at a second loudness setting corresponding to the determined loudness, if the first loudness and the second loudness are different by more than a predetermined amount, are also provided. Means for storing the asset may also be provided.

In accordance with another embodiment of the invention, a system for correcting an audio level of a stored program asset is disclosed comprising memory for storing the program asset and a processor coupled to the memory. The processor is programmed to retrieve a stored program asset having audio encoded at a first loudness setting, identify dialog of the asset, and determine a loudness of the dialog. The processor is further programmed to re-encode the asset at a second loudness setting corresponding to the determined loudness, if the first loudness setting and the determined loudness are different by more than a predetermined amount.

In accordance with another embodiment of the invention, a method of encoding audio of a program is disclosed comprising receiving a program having audio encoded at a first loudness setting. The method further comprises identifying dialog of the program, determining a loudness of the dialog and comparing the determined loudness to the loudness setting. The program is encoded for storage at a second loudness setting corresponding to the determined loudness, if the first loudness setting and the determined loudness are different by more than a predetermined amount. Otherwise, the program is encoded at the first loudness setting.

In accordance with a related embodiment of the invention, a system for correcting an audio level of a stored program is disclosed comprising a receiver to receive audio encoded at a first loudness setting and a processor. The processor is programmed to identify dialog of the program, determine a loudness of the dialog, compare the determined loudness to the first loudness setting and encode the program for storage at a second loudness setting corresponding to the second loudness if the first loudness and the second loudness are different by more than a predetermined amount. The processor may also be programmed to encode the program at the first loudness setting if the first loudness and the second loudness are different by more than a predetermined amount.

In accordance with another embodiment of the invention, a method of encoding audio of a program is also disclosed comprising retrieving a stored program comprising audio, identifying dialog of the audio, determining a loudness of the dialog and encoding the program at a loudness setting corresponding to the determined loudness. The program may then be transmitted with the encoded loudness setting. Dialog may be identified by dividing the audio into time intervals, determining a loudness of each time interval, and identifying intervals with intermediate loudnesses. The loudness of the dialog may then be determined by determining a loudness of the intervals with intermediate loudnesses.

In accordance with a related embodiment, a system for encoding audio of a program is also disclosed comprising memory to store the program and a processor. The processor is programmed to retrieve the stored program, identify dialog of the audio, determine a loudness of the dialog and encode the program at a loudness setting corresponding to the determined loudness. The processor may be programmed to identify dialog by dividing the audio into time intervals, determining a loudness of each time interval and identifying intervals with intermediate loudnesses. The processor may be programmed to determine the loudness of the dialog by determining a loudness of the intervals with intermediate loudnesses. The processor is further programmed to encode the program at a loudness setting corresponding to the determined loudness. A transmitter may be coupled to the processor, to transmit the program with the encoded loudness setting.

DETAILED DESCRIPTION OF THE PREFERRED EMBODIMENTS

To correct for improperly encoded audio in stored program assets, which may result in unexpected volume changes as a program switches to a commercial or a subsequent program, the loudness of audio of a stored program asset is determined and the audio of the asset is re-encoded, if necessary. The audio may be determined by identifying audio of intermediate loudnesses, which is considered to be dialog. The loudness of the dialog is determined, preferably by psycho-acoustic criteria, such as Leq (A), and compared to the loudness setting of the encoded audio. If the determined loudness and the loudness setting are different by more than a predetermined amount, the audio of the asset is re-encoded at a loudness setting corresponding to the determined loudness. If the determined loudness and the loudness setting are not different by more than the predetermined amount, the loudness setting is acceptable. The method may be applied to programs as they are received, as well. Sources of programming may also apply the method to pre-recorded programs so that the audio is properly encoded before transmission.

Figure 1:
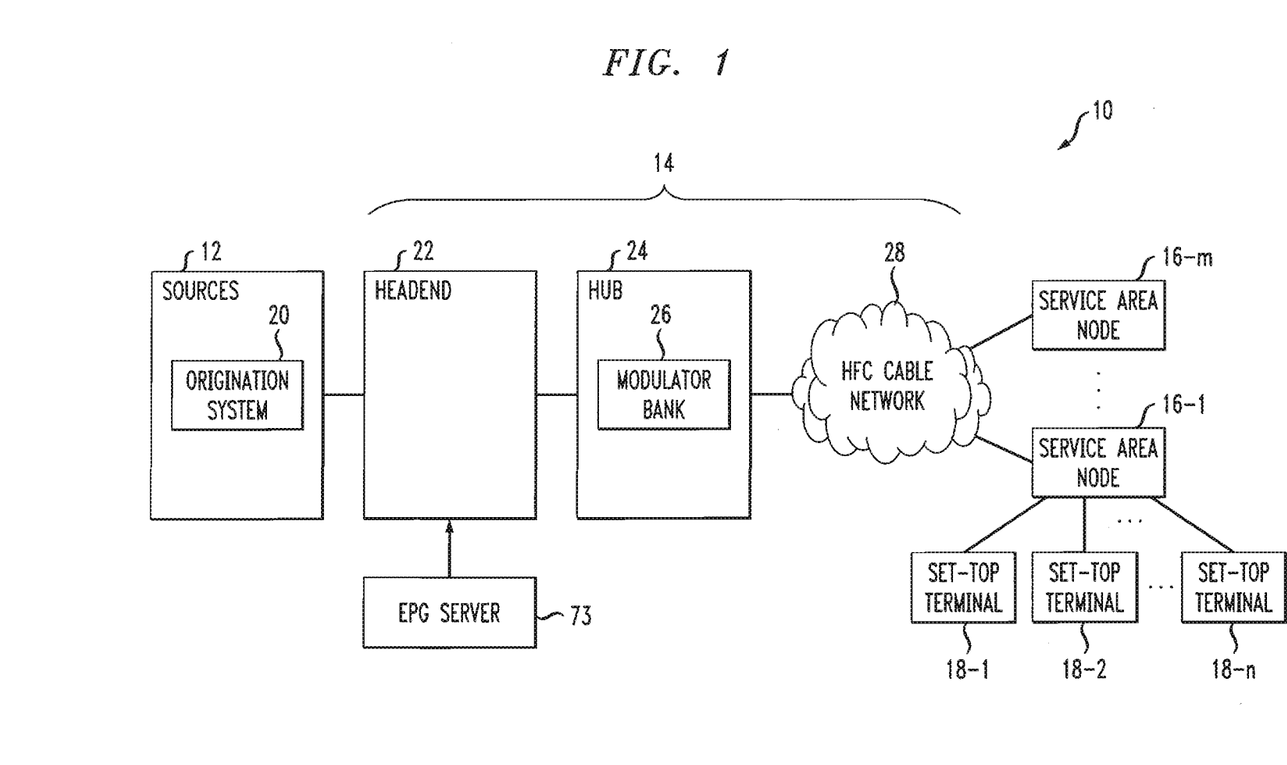
FIG. 1 is a block diagram of certain components of a broadband communications system including a cable system that embodies principles of the invention.

FIG. 1 is a block diagram of certain components of a broadband communications system 10 embodying principles of the invention. The system includes one or more program sources 12, cable system 14 and a plurality of service area nodes 16-1 through 16-m in a neighborhood. Service area node 16-1, for example, is coupled to set-top terminals 18-1 through 18-n, at customer's TV's. Cable system 14 delivers information and entertainment services to set-top terminals 18-1 through 18-n.

Sources 12 create and broadcast programming to cable system 14 through an origination system 20. An example of an origination system is discussed further below and is described in more detail in copending, commonly assigned application Ser. No. 10/263,015 ("the 015 application"), filed on Oct. 2, 2002, which is incorporated by reference herein. Sources 12 include analog and digital satellite sources that typically provide the traditional forms of television broadcast programs and information services. Sources 12 also include terrestrial broadcasters, such as broadcast networks (CBS, NBC, ABC, etc., for example), which typically transmit content from one ground antenna to another ground antenna and/or via cable. Sources 12 may also include application servers, which typically provide executable code and data for application specific services such as database services, network management services, transactional electronic commerce services, system administration console services, application specific services (such as stock ticker, sports ticker, weather and interactive program guide data), resource management service, connection management services, subscriber care services, billing services, operation system services, and object management services; and media servers, which provide time-critical media assets such as Moving Pictures Experts Group 2 ("MPEG-2") standard encoded video and audio, MPEG-2 encoded still images, bit-mapped graphic images, PCM digital audio, MPEG audio, Dolby Digital AC-3 audio, three dimensional graphic objects, application programs, application data files, etc. Although specific examples of programs and services which may be provided by the aforementioned sources are given herein, other programs and services may also be provided by these or other sources without departing from the spirit and scope of the invention. For example, one or more sources may be vendors of programming, such as movie or on-demand programming, for example.

Cable system 14 includes headend 22, which processes program materials, such as TV program streams, for example, from sources 12 in digital and analog forms. Digital TV streams may be formatted according to Motorola Digicipher System, Scientific Atlanta Powerview Systems, the Digital Satellite System (DSS), Digital Broadcast Services (DBS), or Advanced Television Standards Committee (ATSC) standards, for example. Analog TV program streams may be formatted according to the National Television Standards Committee (NTSC) or Phase Alternating Line (PAL) broadcast standard. Headend 22 extracts program content in the analog and digital TV streams and reformats the content to form one or more MPEG-2 encoded transport streams for transmission to users at set-top terminals 18-1 through 18-n. Such reformatting may be applied to received streams that are already in an MPEG-2 format. This stems from the fact that the digital content in the received MPEG-2 streams are typically encoded at a variable bit rate (VBR). To avoid data burstiness, headend 22 may re-encode such digital content at a constant bit rate (CBR) to form transport streams in a conventional manner. Headend 22 is discussed in more detail below, with respect to FIGS. 2 and 3.

The generated program signal transport streams are typically transmitted from headend 22 to hub 24 via Internet Protocol ("IP") transport over optical fiber. The program signal streams may also be transmitted as intermediate frequency signals that have been amplitude modulated ("AM") or as a digital video broadcast (DVB) a synchronous serial interface (ASI) that has also been AM modulated. Hub 24 includes modulator bank 26, among other components. Modulator bank 26 includes multiple modulators, each of which is used to modulate transport streams onto different carriers. Hub 24 is connected to hybrid fiber/coax (HFC) cable network 28, which is connected to service area nodes 16-1 through 16-m. The transport streams may be recorded in headend 22 so that the users at the set-top terminals may manipulate (e.g., pause, fast-forward or rewind) the programming content in the recorded streams in a manner described in the '015 application, which is incorporated by reference herein. In addition, in accordance with an embodiment of the invention, the program signal streams are processed and stored by headend 22 based, at least in part, on the segmentation messages, as described further below.

Figure 2:
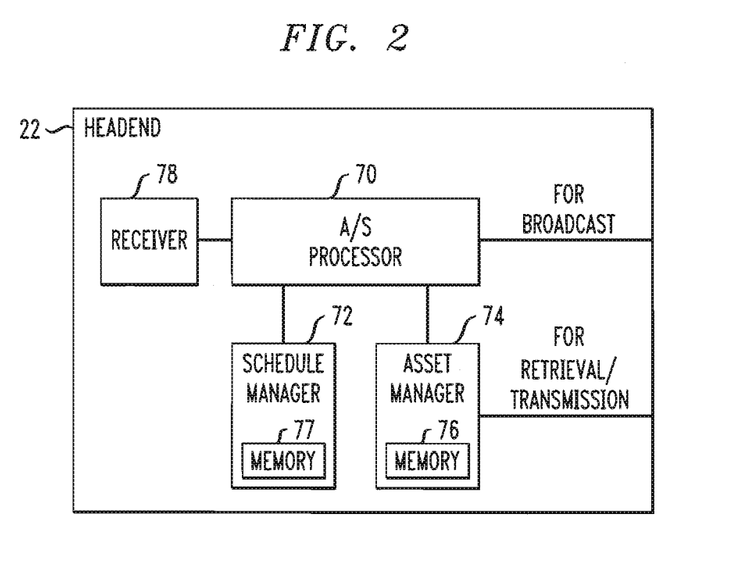
FIG. 2 shows certain components of an example of headend of the cable system of FIG. 1, including an acquisition/staging ("A/S") processor.
Figure 3:
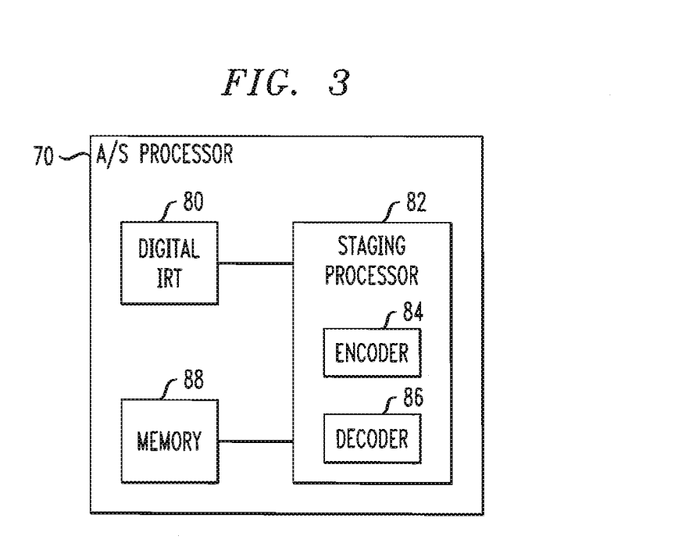
FIG. 3 shows certain components of the A/S processor of FIG. 2.

FIG. 2 shows certain components of an example of headend 22 of cable system 14. Headend 22 includes an acquisition and staging ("A/S") processor 70, schedule manager 72 and asset manager 74. Asset manager 74 includes memory 76. Schedule manager includes memory 77. Headend 22 receives programming from sources 12 via receiver 78, which couples the received program signal streams to A/S processor 70. Receiver 78 may comprise one or more satellite dishes, for example. A/S processor 70 may comprise an acquisition processor, such as a digital integrated receive transcoder ("IRT") 80 and a staging processor 82, as shown in FIG. 3. A/S processor 70 receives and processes program streams for broadcast to service area nodes 16-1 through 16-m via hub 24 and HFC cable network 28. IRT 80 receives the digital program stream, decodes the stream and outputs an MPEG-2 signal stream to staging processor 82. Staging processor 82 may re-encode a VBR program stream to a CBR stream, if necessary, as discussed above. The broadcast of program signal streams and headend 22 are described in more detail in the '015 application, identified above and incorporated by reference herein.

Staging processor 82 includes an audio encoder 84, such as the Motorola SE1000 encoder, available from Motorola, Inc., Schaumburg, Ill., and its distributors. A Dolby software encoder may also be used. The staging processor 82 also includes an audio decoder 86, such as the Dolby DP564 decoder or a Dolby software decoder. Memory 88 is also preferably provided in A/S processor 70, coupled to or part of staging processor 82.

In this example, A/S processor 70 is also a program splicer. Staging processor 82 may segment program streams based on segmentation messages in the stream and externally provided program schedule information, under the control of schedule manager 72, as described in copending, commonly assigned application Ser. No. 10/428,719 ("the '719 application"), filed on May 1, 2003, which is incorporated by reference herein. Briefly, such segmentation messages may be inserted into the program stream by a source of the program stream, to indicate upcoming events, such as a start and end of a program and program portion. Program portions may include chapters, such as a monolog, skit, musical performance, guest appearance, sports highlight, interview, weather report, innings of a baseball game, or other desired subdivisions of a program. A program portion may also comprise national and local advertising. Unscheduled content (such as overtime of a sports event) may also be a defined program portion. In one example, the segmentation message may indicate the time to the event, which is used by the staging processor 82 to segment the program into assets for storage at the indicated time. Separate assets may be formed of the program as a whole, the program without advertising and/or chapters, the advertising, the chapters and other programs portions, for example. The assets may be stored in memory 76. When a user of system 14 requests a program, the corresponding stored program asset may be retrieved for transmission. If necessary, the program may be assembled from multiple assets prior to transmission. For example, assets comprising the advertising to be provided with the program may be combined with the program asset itself, prior to transmission.

The segmentation messages may also be used by the cable system to adjust program start and end times provided in the electronic program quote ("EPG"), as is also described in the 719 application, which is incorporated by reference herein. Start and end times for chapters and advertising, which is typically not provided in the EPG, may also be derived by cable system 14 based on the segmentation messages. EPG information may be provided to schedule manager 72 by a server 73 (as shown in FIG. 1) in the form of a program guide data stream that includes a program identification code (PIC) and the approximate program start and end times for each program.

Asset manager 74, including memory 76, is coupled to A/S processor 70, to receive the expanses of programs and program portions segmented by A/S processor 70, format the segmented programs and program portions (if necessary) to create respective assets, and store the assets. Memory 76 and memory 77 may be a disk cache, for example, having a memory capacity on the order of terabytes. Asset manager 74 formats the expanses into assets by associating a program identification code (PIC) with each expanse, facilitating location and retrieval of the asset from memory 76. The PIC information may be derived from or may actually be the segmentation message in program stream. Program portion assets, such as chapter and advertising portions, may also be formatted by being associated with the PIC of the program and another code or codes uniquely identifying the portion and the location of the portion in the program. Such codes may be formatted by A/S processor 70, as well.

It is noted that in addition to the raw content, program specific information ("PSI") may also be associated with or provided in the asset, to describe characteristics of the asset. For example, PSI may describe attributes that are inherent in the content of the asset, such as the format, duration, size, encoding method, and Dolby AC-3 specific PSI. The DIALNORM setting may be in the synchronization frame, discussed above. Values for asset PSI are also determined at the time the asset is created by asset manager 74 or A/S processor 70.

Figure 4:
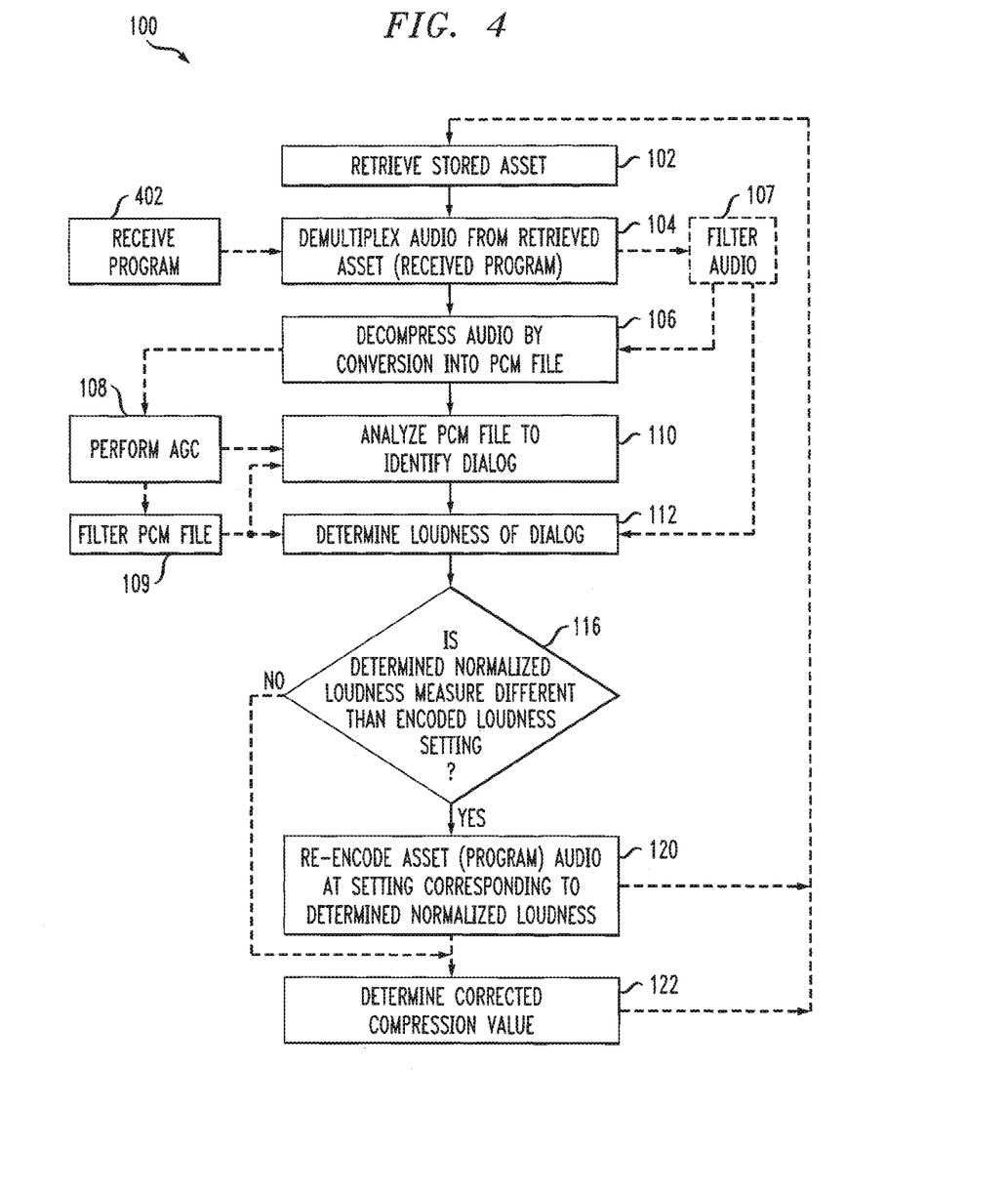
FIG. 4 is an example of a method in accordance with an embodiment of the invention.

One embodiment of the present invention, described below, is applied to program assets stored by a cable system 14 or other such system for later transmission. While the assets may be defined through the use of segmentation messages, as described above and in the '719 application, that is not required. Assets may be defined in other ways, as well. In accordance with this embodiment of the invention, the encoded audio level of a stored asset is determined and corrected, if necessary. FIG. 4 is an example of a method 100 in accordance with this embodiment.

In this example, a stored asset is retrieved by staging processor 82 from the memory 76 of the asset manager 74, and stored in memory 88, in Step 102. The asset may be a program or a program portion, such as the program without advertising, advertising or chapters, for example. The audio of the stored asset is encoded at a loudness setting established by the source 12 of the asset. The audio portion of the retrieved asset is demultiplexed from the asset, in Step 104. Staging processor 82 may demultiplex the audio in a conventional manner.

The demultiplexed audio portion is preferably decompressed in Step 105. For example, the demultiplexed audio portion may be decompressed by being converted into a pulse coded modulation ("PCM") format by staging processor 82, in a manner known in the art, in Step 106. Typically, the format of the demultiplexed audio will initially be its input format, which may be Dolby AC-3 format or MPEG-2, for example. Decompression to PCM format facilitates subsequent processing. The audio in PCM format is stored in memory 88 or other such memory, as a PCM file. While preferred, conversion to PCM is not required. The audio portion may be decompressed by conversion into other formats, as well, as is known in the art.

Since the compressed data uses frequency banding techniques, the demultiplexed audio portion may be filtered to remove signals outside of the range of typical dialog, in Step 107. The range may be about 100 to about 1,000 Hertz, for example.

Automatic gain control ("AGC") may optionally be applied to the audio in the PCM file, in Step 108. An AGC algorithm may be executed by the staging processor 82. AGC typically improves the signal-to-noise ("S/N") ratio of the audio signal and facilitates encoding. To conduct AGC, the audio signal may be averaged. Typically, the peaks are averaged, for example. The gain may be adjusted to reference the audio level of the audio to an analog reference level, such as 0 dBs, 4 dBs or 10 dBs. The entire audio may be adjusted by a constant amount. AGC algorithms are known in the art. If AGC is performed in Step 108, conversion to PCM format in Step 106 is particularly preferred.

The PCM file may be filtered, in Step 109 instead of Step 107. As above, the PCM file may be filtered by staging processor 82 to remove signals outside of the range of typical dialog, such as about 100 to about 1,000 Hertz, for example.

The PCM file is analyzed to identify likely dialog sections, in Step 110. Normal or average audio levels of the PCM file are assumed to be dialog. Preferably, high and low audio levels, and silent levels, of the PCM file are not included in the identification, since these sections typically do not include dialog. Loudness of the dialog is determined in Step 112. The determined loudness is preferably measured based on psycho-acoustic criteria. For example, the loudness may be measured based on a human hearing model so that the measure reflects the subjective perceived loudness by the human ear.

Figure 5:
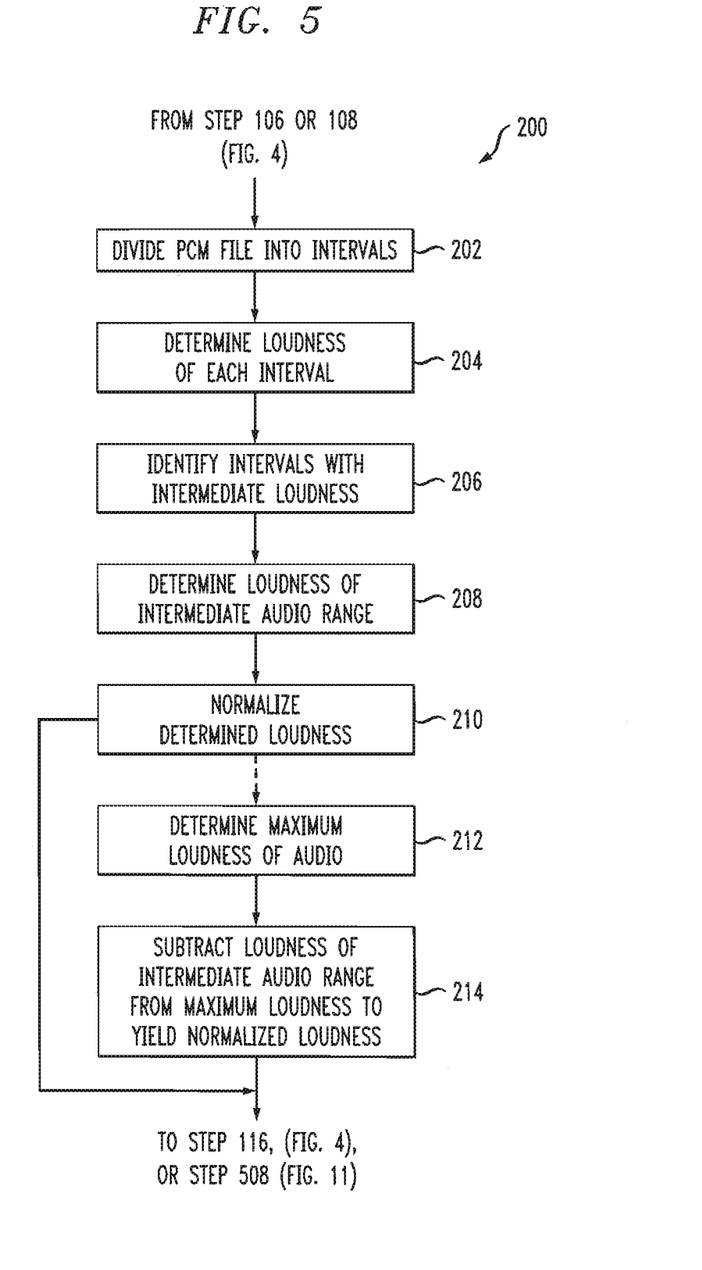
FIG. 5 is an example of a method for implementing certain steps of the method of FIG. 4, in accordance with one embodiment of the invention.
Figure 6:
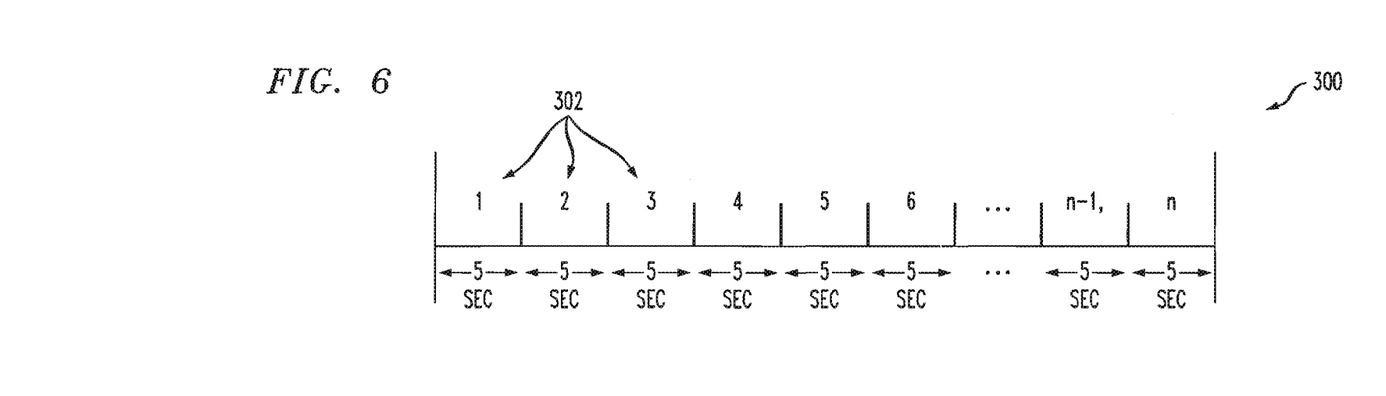
FIG. 6 is an example of an audio file divided into intervals in accordance with the method of FIG. 5.

FIG. 5 is an example of a method 200 for implementing Steps 110 and 112 of FIG. 4, in accordance with one embodiment of the invention. In this example, to identify dialog, staging processor 82 divides the PCM file into intervals, in Step 202. For example, the file 300, shown schematically in FIG. 6, may be divided into intervals 302. Each interval 302 may be 5 or 10 seconds long, for example. In this example, each interval is 5 seconds long. At least about 10 to about 30 minutes of content is preferably divided at one time. More preferably, the entire program portion of the PCM file is divided, as shown in FIG. 6. The length of individual intervals may be varied to better separate interval portions having a loudness from silent interval portions. For example, if a first interval is primarily not silent and a second, adjacent interval is primarily silent except for a small portion (1 second, for example) proximate the first interval, that 1 second may be made part of the first interval. The first interval may then have a length of six seconds and the second interval may then have a length of 4 seconds. Staging processor 82 may define and adjust the intervals 302.

A loudness of each interval 302 is then determined, in Step 204. As discussed above with respect to Step 112, the determined loudness is preferably measured based on psycho-acoustic criteria. Leq (A) may be used, for example. To perform Leq (A) for each interval, a Fourier Transform of the audio signal of each interval is performed to separate the audio signals of each interval into frequency bands. Leq (A) weighting multiplication is performed on each frequency band in the interval, the result is integrated or averaged, and passed through filter bands, as is known in the art. A fast Fourier Transform may be used, for example.

Figure 7:
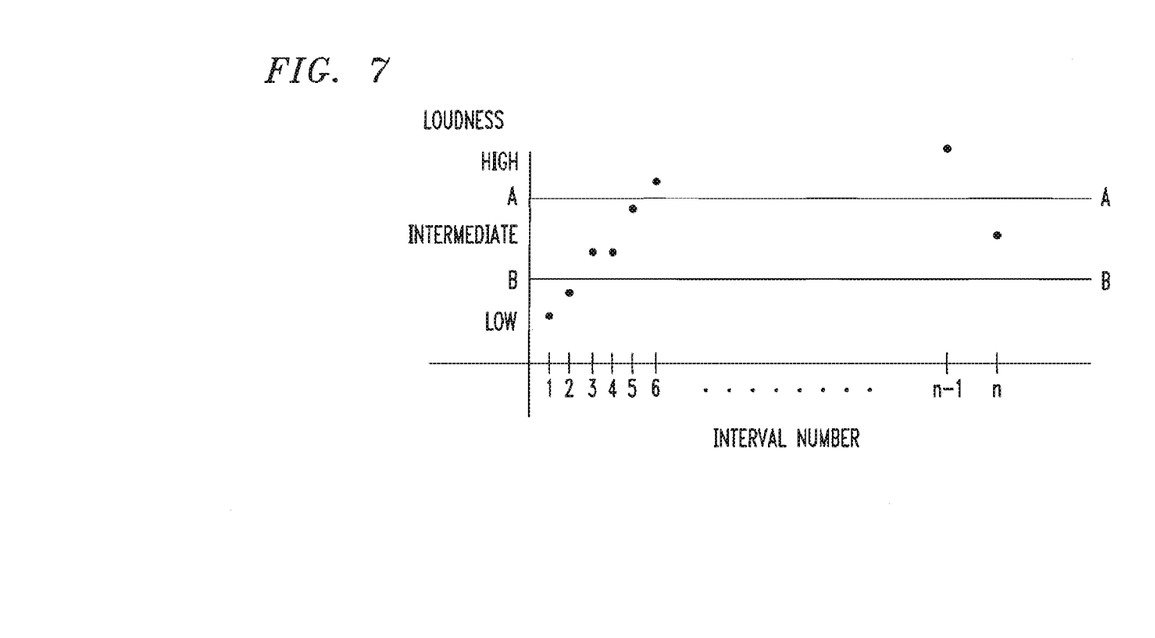
FIG. 7 is a graph of the intervals of FIG. 6, and their loudnesses.

Intervals 302 having intermediate loudnesses are identified in Step 206. Intervals 302 having intermediate loudnesses are considered to contain dialog. To identify such intervals in this example, the distribution of measured loudnesses are divided into loudness ranges. At least three ranges are preferably defined, as shown in FIG. 7. Loudness values above a first threshold A are classified in a High Category. Loudness values below a second threshold B (lower than the first threshold A) are classified in a Low Category. Loudness values between the first and second thresholds A, B have an intermediate loudness and are classified in an Intermediate Category. The thresholds A, B may be defined by analyzing the concentration of audio volume levels with a histogram to determine the highest density of volume levels, for example.

Figure 8:
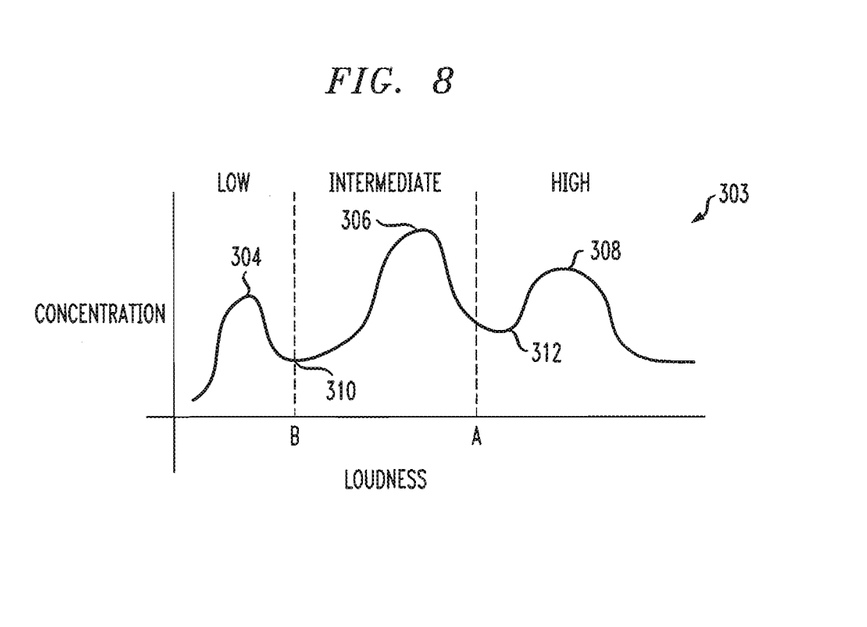
FIG. 8 is an example of such a histogram of a typical loudness distribution.

FIG. 8 is an example of such a histogram of a typical loudness distribution 303. Most programs will include three or more peaks 304, 306, 308. The first peak 304 is indicative of the highest concentration of loudness values in the Low Category, the second peak 306 is indicative of the highest concentration of loudness values in the Intermediate Category and the third peak 308 is indicative of the highest concentration of loudness values of the High Category. A first minimum 310 typically appears between the first peak 304 and the second peak 306, and a second minimum 312 typically appears between the second peak and the third peak 308. Preferably, the threshold B is defined at a loudness value at the first minimum 310 and the threshold A is defined at a loudness value at the second minimum 312.

A loudness of the audio in the Intermediate Category is then determined, in Step 208. The measure may be the average, mean, or median of the loudness measures of each interval 302 in the Intermediate Category, for example.

The determined loudness is preferably normalized with respect to the loudness of the program, in Step 210. Steps 212 and 214 are examples of a normalization procedure. A loudness of the audio portion of the entire program is determined, in Step 210. As above, psychoacoustic criteria, such as Leq (A), is preferably used. More preferably, the same psychoacoustic criteria is used for all loudness measurements. A maximum loudness of the audio of the program is then determined, in Step 212. The maximum loudness of the program may be determined from the histogram of FIG. 7, for example, by identifying the interval with the highest loudness, here interval n−1. The loudness of the intermediate audio range (in logarithm) is subtracted from the maximum loudness (in logarithm) to yield a fraction (in logarithm) of the maximum loudness (100% digital, full scale), in Step 214. This normalized loudness measure is the DIALNORM in the context of a Dolby AC-3 format.

Returning to method 100 in FIG. 4, the normalized loudness of the dialog is compared to the encoded loudness setting, in Step 116. Staging processor 82 may determine the encoded loudness setting by checking the DIALNORM in the PSI, for example. If the two loudness measures are different by less than a predetermined amount, such as 1 or 2 dBs, for example, the audio of the asset has been encoded at an acceptable loudness setting. The method 100 may then return to Step 102 to be performed on a new asset, or may be ended. If the determined loudness of the dialog and the encoded loudness setting are different by greater than the predetermined amount, then the asset is re-encoded at a loudness setting corresponding to the determined loudness of the dialog by encoder 84, in Step 120. The method 100 may end or may return to Step 102 to be performed on a new asset.

Optionally, method 100 may proceed from Step 120 or Step 116 to determine a corrected compression value for the stored audio, in Step 122. Whether to correct the compression value may be dependent on the DRC program profile, which is typically identified in program PSI, and the dynamic range of the audio. If the dynamic range of the audio is unexpectedly large for the program profile of the asset, then compressing the program to reduce peaks and valleys could be advantageous. Reducing the range ensures that the volume will not peak out at extremes. Dynamic range may be determined from the histogram of FIG. 7 by comparing the loudness of the highest interval, here interval n−1, to the loudness of the lowest interval, here interval 1, for example. The dynamic range in a Dolby DRC system may be changed by changing the program profile, such as changing from Film Standard to Film Heavy, for example. If the dynamic range is not wide enough, the program type may be changed to a less compressed profile, as well.

In accordance with another embodiment, instead of conducting method 200 of FIG. 5, dialog may be determined solely by filtering the PCM file, in Step 109 or Step 107.

Figure 9:
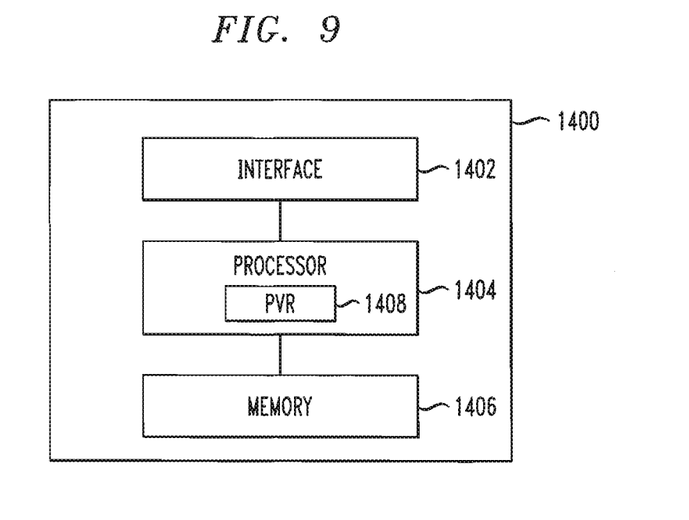
FIG. 9 is an example of a terminal, which is representative of a set-top terminals in the system of FIG. 1.

Other components of cable system 14 may implement embodiments of the present invention, as well. For example, FIG. 9 is an example of a terminal 1400, which is representative of the set-top terminals 18-1 through 18-n of FIG. 1. Terminal 1400 is typically coupled to a display device, such as a TV (not shown), at a user location. Terminal 1400 includes interface 1402, processor 1404 and memory 1406. Processor 1404 may include PVR 1408 as well. A program signal stream broadcast by headend 22 is received by interface 1402. Memory 1406 may store programming, such as local advertising, for example, for insertion into a program stream based on segmentation messages, as described in the '719 application, identified above and incorporated by reference herein.

Processor 1404 may retrieve each piece of advertising (and other stored programming) and implement method 100 of FIG. 4, for example, in accordance with an embodiment of the invention. Advertising (and other programming) inserted by the set-top terminal 1400 will thereby have the proper loudness setting when inserted into a program provided by cable system 14. When the program transitions to and from the advertising, it should not, therefore, be necessary for a viewer to change the volume setting on their TV. Method 100 may also be implemented by PVR 1408 on recorded programs, as well. A suitably programmed PVR that is not part of set-top terminal 1400 could implement embodiments of the present invention on recorded programs as well.

The present invention may also be implemented in near real-time by staging processor 82 as a program is received by A/S processor from a source 12 and processed for storage. The staging processor 82 may be or may include a fast processor, such as a 32 bit floating point digital signal processor ("DSP"). A SHARC DSP available from Analog Devices, Inc., Norwood, Mass., may be used, for example.

The methods 100 and 200 of FIGS. 4 and 5, respectively, may be applied to received programs, as well, as indicated by Step 402 and in parenthesis in Steps 104 and 120. A program is received in Step 402. The audio may be demultiplexed from the received program (Step 104), the audio decompressed and converted into PCM (or another such format) (Step 106), the audio filtered (Steps 107, 109), AGC applied (Step 108), and the audio may be divided into intervals (Step 204, FIG. 5), as the program is received. The loudness of each interval may be analyzed (Step 204 of FIG. 5) and the histogram of FIG. 7 generated, as each complete interval of audio is received.

When at least a portion of the complete program has been received, intervals with intermediate loudness may be identified (Step 206) and subsequent steps of the method of FIG. 5 and FIG. 7 may be performed, rapidly. If the program is less than 1 hour long, for example, it is preferred to wait until the entire program has been received before identifying an intermediate category. If a program is over an hour long, the intermediate category may be identified after the first hour has been received, for example. An intermediate category for program portions, such as chapters and advertising, may also be determined after that program portion has been received. Program portions may be identified through segmentation messages, as described above and in the '719 application, which is incorporated by reference, herein. The program audio may be re-encoded at a corrected loudness setting and compression value, if necessary. The program may then be broadcast and/or processed and stored in memory 76 as an asset.

Figure 10:
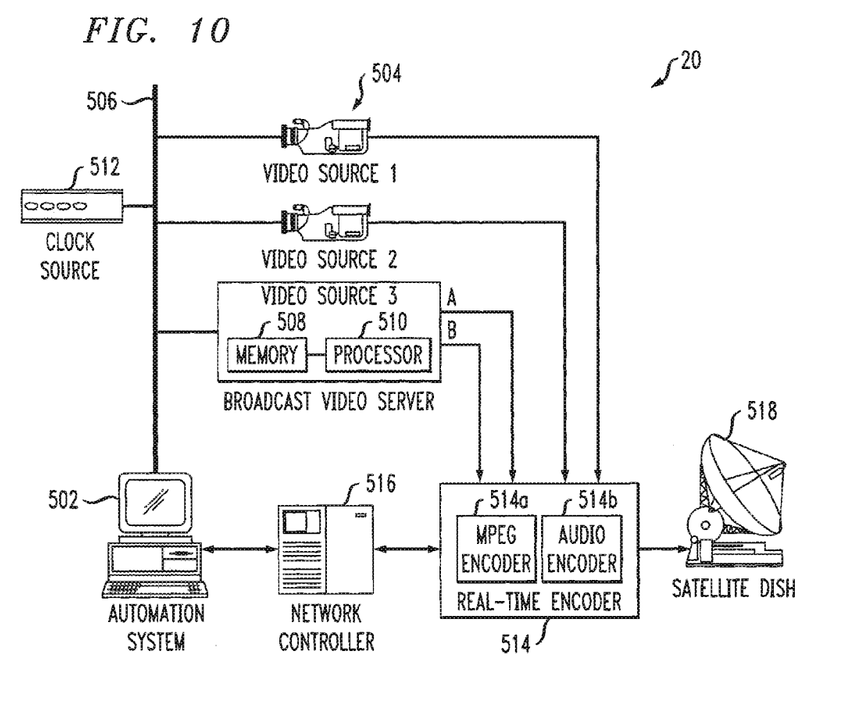
FIG. 10 is block diagram of an example of a source that embodies aspects of another embodiment of the invention.

Aspects of the present invention may be applied to at least certain programs provided by sources 12, as well. FIG. 10 is a block diagram of an example of an origination system 20 of a source 12 for uplinking video program transport signal streams with segmentation messages, in accordance with an embodiment of the invention. Origination system 20 comprises automation system 502, which controls operation of system 20. Segmentation points of a program stream may be identified by an operator through automation system 502. Video sources 504, such as Video Source 1, Video Source 2 and Video Source 3, are coupled to automation system 502 through data bus 506. Video sources 504 provide program signal streams to be segmented, to automation system 502. Video Sources 1 and 2 represent live feeds, such as sports events, while Video Source 3 represents stored video of pre-recorded TV programs and movies, for example. Video Source 3 may be a broadcast video server comprising, in part, memory 508 and a processor 510. Program audio is typically stored in memory 508 in an uncompressed format, such as in a PCM file.

Clock source 512 is also coupled to data bus 506, to provide timing for system 20. Encoder 514 is a real time encoder coupled to video sources 504 to receive and encode the analog video streams into an MPEG-2 single program transport stream, multiplexed with Dolby AC-3 encoded audio, as described above, for example. Two outputs A, B are shown from Video Source 3 to encoder 514, one to convey the audio PCM file and the other to convey the determined loudness setting. Encoder 514 may comprise an MPEG encoder 514a and an audio encoder 514b, such as a Motorola SE1000, identified above, or a Dolby software encoder, for example. Network controller 516 is a control and management interface to encoder 514 and an interface to automation system 502 for insertion of segmentation messages. Transmitter 518, such as a satellite dish, is coupled to encoder 514. Transmitter 518 acts as an interface to transmit the program signal transport stream. Origination System 20 may provide segmentation messages in the transport signal stream, as described above and in the '719 application, identical above and incorporated by reference herein.

Figure 11:
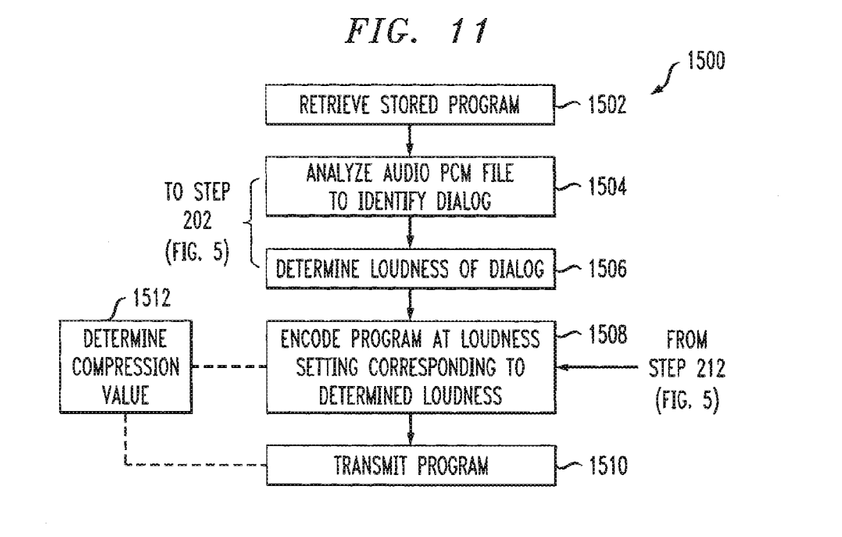
FIG. 11 is an example of a method in accordance with another embodiment of the invention, that may be implemented by the source of FIG. 10.

FIG. 11 is an example of a method 1500 in accordance with another embodiment of the invention, that may be implemented by origination system 20 to properly encode at least the audio of pre-recorded programs.

The pre-recorded program may be retrieved in Step 1502. The program may be stored in memory 508 of Video Source 3 (broadcast video server) and may be retrieved by processor 510, for example.

As mentioned above, the audio portion of the pre-recorded program is typically stored non-compressed, in a PCM file. Other file formats may be used, as well. The loudness of the dialog is determined, in step 1506. Dialog may be identified and loudness determined (Steps 1504 and 1506) by method 200 of FIG. 5, for example. Dialog may be identified in other manners as well, such as frequency filtering, as described above.

The program may be encoded at a loudness setting corresponding to the determined loudness, in Step 1508. The audio PCM file may be provided to encoder 514 along line A while the determined loudness setting may be provided to encoder 514 along line B. Encoder 514 may encode and compress the PCM file into Dolby AC-3 format, for example, multiplex the video portion of the program in MPEG-2, for example, and multiplex the audio and video.

The program may be transmitted in Step 1510. The multiplexed audio and video may be transmitted by satellite dish 518, for example.

Alternatively, a compression value of the audio may be determined in Step 1512 prior to transmission. For example, the DRC program profile may be set based on the dynamic range of the audio, based on the histogram of FIG. 7. The program may then be transmitted in Step 1510.

The audio of pre-recorded programs provided by source 12 may thereby be properly encoded and compressed, eliminating the necessity of correcting the encoded audio at the head end of cable system 14.

Method 1500 may be used to properly encode the audio of a non-compressed program or an encoded program without a loudness setting such as DIALNORM, as well. For example, MPEG encoded audio does not have a loudness setting.

The system and system components are described herein in a form in which various functions are performed by discrete functional blocks. However, any one or more of these functions could equally well be embodied in an arrangement in which the functions of any one or more of those blocks or indeed, all of the functions thereof, are realized, by one or more appropriately programmed processors, for example.

While in the embodiments above, Dolby AC-3 format is generally used to encode audio, the invention may be used with other encoding techniques, such as MPEG-2, for example.

The foregoing merely illustrates the principles of the invention. It will thus be appreciated that those skilled in the art will be able to devise numerous other arrangements that embody the principles of the invention and are thus within the spirit and scope of the invention, which is defined by the claims, below.

What is claimed is:

1. A method of correcting an audio level of a program asset, comprising:
   retrieving the program asset, the program asset comprising audio and metadata specifying a first loudness setting;
   identifying dialog of the audio;
   determining a loudness of the dialog;
   comparing the determined loudness to the first loudness setting; and
   re-encoding the program asset at a second loudness setting corresponding to the determined loudness, when the first loudness setting and the determined loudness are different by more than a predetermined amount.

2. The method of claim 1, wherein identifying the dialog comprises:
dividing the audio into time intervals;
determining a loudness of each time interval; and
identifying time intervals with intermediate loudnesses.

3. The method of claim 2, wherein determining the loudness of each time interval is based at least in part on psycho-acoustic criteria.

4. The method of claim 2, wherein determining the loudness of each time interval is based at least in part on Leq (A).

5. The method of claim 2, wherein identifying the dialog further comprises determining a loudness of the time intervals with intermediate loudnesses.

6. The method of claim 5, wherein determining the loudness of the time intervals with intermediate loudnesses comprises computing a function of the loudnesses of the time intervals with intermediate loudnesses.

7. The method of claim 6, wherein the function is one of an average, a mean, and a median of the loudnesses of the time intervals with intermediate loudnesses.

8. The method of claim 5, wherein determining the loudness of the time intervals with intermediate loudnesses comprises determining a DIALNORM of the time intervals with intermediate loudnesses.

9. The method of claim 1, wherein identifying the dialog comprises filtering the audio.

10. The method of claim 9, wherein filtering the audio comprises disregarding the audio outside of a range of from about 100 Hertz to about 1,000 Hertz.

11. The method of claim 1, wherein the program asset comprises one of a program, a chapter of a program, and an advertisement.

12. The method of claim 1, further comprising storing the program asset with the re-encoded loudness setting.

13. The method of claim 1, further comprising normalizing the determined loudness of the dialog.

14. The method of claim 1, wherein the metadata specifies the first loudness setting as a value.

15. The method of claim 14, wherein the value corresponds to an intended gain for playback.

16. The method of claim 1, wherein the program asset specifies the first loudness setting in a synchronization frame of the audio.

17. A system for correcting an audio level of a program asset, the system comprising:
a memory operative to store the program asset, the program asset comprising audio and metadata specifying a first loudness setting; and
a processor coupled to the memory, the processor programmed to:
retrieve the program asset;
identify dialog of the program asset;
determine a loudness of the dialog; and
re-encode the program asset at a second loudness setting corresponding to the determined loudness, when the first loudness setting and the determined loudness are different by more than a predetermined amount.

18. The system of claim 17, wherein identifying the dialog comprises:
dividing the audio into time intervals;
determining a loudness of each time interval; and
identifying time intervals with intermediate loudnesses.

19. The system of claim 18, wherein determining the loudness of each time interval is based at least in part on psycho-acoustic criteria.

20. The system of claim 18, wherein determining the loudness of each time interval is based at least in part on Leq (A).

21. The system of claim 18, wherein identifying the dialog further comprises determining a loudness of the time intervals with intermediate loudnesses.

22. The system of claim 21, wherein determining the loudness of the time intervals with intermediate loudnesses comprises computing a function of the loudnesses of the time intervals with intermediate loudnesses.

23. The system of claim 21, wherein determining the loudness of the time intervals with intermediate loudnesses comprises determining a DIALNORM of the time intervals with intermediate loudnesses.

24. The system of claim 23, wherein identifying the dialog comprises filtering the audio.

25. The system of claim 17, wherein the processor is further programmed to store the program asset with the re-encoded loudness setting.

26. The system of claim 17, wherein the metadata specifies the first loudness setting as a value.

27. The system of claim 26, wherein the value corresponds to an intended gain for playback.

28. The system of claim 17, wherein the program asset specifies the first loudness setting in a synchronization frame of the audio.

29. The system of claim 17, wherein the processor forms a portion of a head end of a broadband communications system.

30. The system of claim 17, wherein the processor forms a portion of an acquisition and staging processor in a head end of a broadband communications system.

31. The system of claim 17, wherein the processor forms a portion of a set-top terminal of a broadband communications system.

32. The system of claim 31, wherein the program asset is stored locally to the set-top terminal.

* * * * *